US012727203B2

(12) United States Patent
Wu et al.

(10) Patent No.: US 12,727,203 B2
(45) Date of Patent: Sep. 1, 2026

(54) SEMICONDUCTOR DEVICE AND FABRICATING METHOD THEREOF

(71) Applicant: Fujian Jinhua Integrated Circuit Co., Ltd., Quanzhou City (CN)

(72) Inventors: Gang Wu, Quanzhou City (CN); Mingru Ge, Quanzhou City (CN); Guoguo Kong, Quanzhou City (CN); Shiwei He, Quanzhou City (CN); Wangqin Yang, Quanzhou City (CN); Yongjian Yu, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 372 days.

(21) Appl. No.: 18/239,100

(22) Filed: Aug. 28, 2023

(65) Prior Publication Data

US 2024/0355933 A1 Oct. 24, 2024

(30) Foreign Application Priority Data

Apr. 20, 2023 (CN) ......................... 202310429115.1
Apr. 20, 2023 (CN) ......................... 202320901677.7

(51) Int. Cl.
*H10D 30/67* (2025.01)
*H10D 30/01* (2025.01)
*H10D 64/27* (2025.01)

(52) U.S. Cl.
CPC ....... *H10D 30/6757* (2025.01); *H10D 30/025* (2025.01); *H10D 64/517* (2025.01)

(58) Field of Classification Search
CPC ........... H10D 30/6757; H10D 30/6735; H10D 30/501; H10D 30/502; H10D 30/503; H10D 30/504; H10D 30/506; H10D 30/507; H10D 30/508; H10D 30/509; H10D 30/014; H10D 30/019; H10D 30/0191; H10D 30/0193; H10D 30/0194; H10D 30/0195;
(Continued)

(56) References Cited

U.S. PATENT DOCUMENTS 9,443,979 B2 9/2016 Park et al.
9,748,385 B1 * 8/2017 Balakrishnan ..... H10D 30/6713
(Continued)

FOREIGN PATENT DOCUMENTS

CN 115939174 A * 4/2023

*Primary Examiner* — Wael M Fahmy
*Assistant Examiner* — Quinton A Brasfield
(74) *Attorney, Agent, or Firm* — Winston Hsu

(57) ABSTRACT

The present disclosure provides a semiconductor device and a fabricating method thereof includes a source structure, a drain structure, a gate structure, a bottom dielectric layer, a gate dielectric layer, a channel structure, and a metal nitride layer. The source structure and the drain structure are stacked in a vertical direction, and the gate structure is between the drain structure and the source structure. The bottom dielectric layer is disposed between the drain structure and the source structure. The channel structure is disposed between the drain structure and the source structure and is electrically connected the drain structure and the source structure, and the channel structure is partially disposed in the gate structure. The gate dielectric layer is disposed between the channel structure and the gate structure. The metal nitride layer is disposed between the gate dielectric layer and the gate structure.

19 Claims, 12 Drawing Sheets

(58) Field of Classification Search
CPC ........... H10D 30/0196; H10D 30/0197; H10D 30/0198; H10D 62/121; H10D 84/851; H10D 84/852; H10D 84/832; H10D 84/833; H10D 84/013–0133; H10D 84/0128; H10D 84/017; H10D 84/0149; H10D 84/0167; H10D 84/0186; H10D 62/021; H10D 62/149–161; H10D 62/299; H10D 62/307; H10D 30/0277; H10D 30/0218; H10D 30/0219; H10D 30/022; H10D 30/601–608; H10D 30/6219; H10D 30/6715–6721; H10D 30/0223–0229; H10D 30/0215; H10D 30/0221; H10D 64/251–259; H10D 64/647–649; H10D 30/025; H10D 30/0318; H10D 30/63; H10D 30/6728; H10D 84/016; H10D 84/0195; H10D 30/204; H10D 30/027–0278; H10D 62/292; H10B 63/64
See application file for complete search history.

(56) References Cited

U.S. PATENT DOCUMENTS

| | | | | |
|---|---|---|---|---|
| 9,953,978 | B2 | 4/2018 | Xie et al. | |
| 2019/0386145 | A1* | 12/2019 | Ok | H10D 30/43 |
| 2023/0013102 | A1 | 1/2023 | Wang | |
| 2023/0411467 | A1* | 12/2023 | Chung | H10D 30/6729 |
| 2024/0204101 | A1* | 6/2024 | Kong | H10D 30/025 |

* cited by examiner

103
SS
DE
46
34
40
42
28C(28)
30
32
36
32
30
OP3
28A(28)
38
38
26
26
51
24
24
28A(28)
GE
22
22
20
28B(28)
28B(28)
20
OP2
18
16
14
SE
12
10

SEMICONDUCTOR DEVICE AND FABRICATING METHOD THEREOF

BACKGROUND OF THE INVENTION

1. Field of the Invention

The present disclosure relates to a semiconductor device and a fabricating method thereof, and more particularly, to a semiconductor device including a vertical channel structure and a fabricating method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor for reducing the dimension of the transistor unit and/or improving the operation performance of the transistor unit.

SUMMARY OF THE INVENTION

One of the objectives of the present disclosure is to provide a semiconductor device and a method of forming the same, in which a metal nitride layer is additionally formed between a channel structure and a gate structure, to prevent a gate dielectric layer from directly contacting the metal and easily producing high-resistance products, and to improve the operation performance of the semiconductor device thereby.

To achieve the purpose described above, one embodiment of the present disclosure provides a semiconductor device includes a source structure, a drain structure, a gate structure, a bottom dielectric layer, a gate dielectric layer, a channel structure and a metal nitride layer. The source structure and the drain structure are stacked disposed in a vertical direction. The gate structure is disposed between the drain structure and the source structure in the vertical direction. The bottom dielectric layer is disposed between the drain structure and the source structure in the vertical direction. The channel structure is disposed between the drain structure and the source structure in the vertical direction and electrically connected the drain structure and the source structure, the channel structure is partially disposed in the gate structure and includes a channel layer and an insulating layer stacked sequentially in a horizontal direction. The gate dielectric layer is disposed between the channel structure and the gate structure in the horizontal direction. The metal nitride layer is disposed between the gate dielectric layer and the gate structure, wherein a portion of the bottom dielectric layer is sandwiched between the metal nitride layer and the source structure.

To achieve the purpose described above, one embodiment of the present disclosure provides a fabricating method of a semiconductor device including the following steps. A source structure and a drain structure are formed to be stacked in a vertical direction. A gate structure is formed between the drain structure and the source structure in the vertical direction. A channel structure is formed between the drain structure and the source structure in the vertical direction and electrically connected the drain structure and the source structure, and the channel structure is partially disposed in the gate structure and comprising a channel layer and an insulating layer stacked sequentially in a horizontal direction. A gate dielectric layer is formed between the channel structure and the gate structure in the horizontal direction. A metal nitride layer is formed between the gate dielectric layer and the gate structure.

Overall speaking, according to the semiconductor device and the fabricating method thereof, the metal nitride layer is additionally formed between the channel structure and the gate structure, to avoid the dielectric material of the gate dielectric layer directly contacting the metal material of the gate structure and easily producing high-resistance products, and to improve the operation performance of the semiconductor device thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 2 to FIG. 11 are schematic diagrams illustrating a fabricating method of a semiconductor device according to an embodiment of the present disclosure, wherein;

FIG. 2 is a schematic cross-sectional view of a semiconductor device after forming a metal nitride material layer;

FIG. 3 is a schematic cross-sectional view of a semiconductor device after performing an etching back process;

FIG. 4 is a schematic cross-sectional view of a semiconductor device after forming a metal nitride layer;

FIG. 5 is a schematic cross-sectional view of a semiconductor device after forming a gate dielectric material layer;

FIG. 6 is a schematic cross-sectional view of a semiconductor device after forming a first semiconductor material layer;

FIG. 7 is a schematic cross-sectional view of a semiconductor device after forming a first semiconductor layer;

FIG. 8 is a schematic cross-sectional view of a semiconductor device after forming a second semiconductor material layer;

FIG. 9 is a schematic cross-sectional view of a semiconductor device after forming an insulating material layer;

FIG. 10 is a schematic cross-sectional view of a semiconductor device after forming an insulating layer; and FIG. 11 is a schematic cross-sectional view of a semiconductor device after forming a channel structure.

DETAILED DESCRIPTION

To provide a better understanding of the presented invention, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
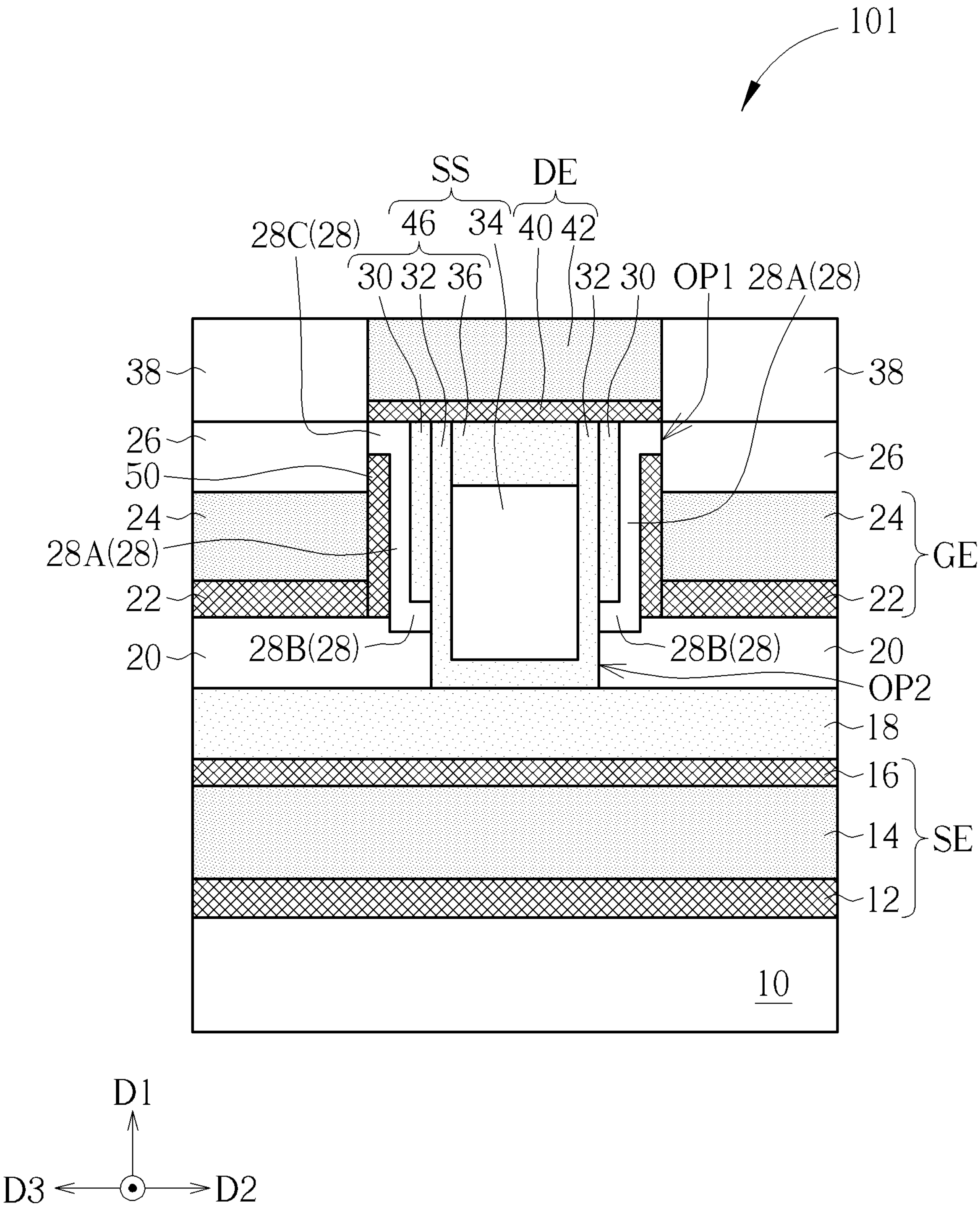
FIG. 1 is a cross-sectional schematic diagram illustrating a semiconductor device according to a first embodiment of the present disclosure.

Please refer to FIG. 1. FIG. 1 is a cross-sectional schematic drawing illustrating a semiconductor device 101 according to a first embodiment of the present disclosure. As shown in FIG. 1, the semiconductor device 101 includes a source structure SE, a bottom dielectric layer 20, a gate structure GE, a gate dielectric layer 28, a channel structure SS, a drain structure DE and a metal nitride layer 50. The drain structure DE and the source structure SE are stacked one over another in a vertical direction D1, and the gate structure GE is disposed on the source structure SE, between the drain structure DE and the source structure SE. The channel structure SS is partially disposed in the gate structure GE in the vertical direction D1, and also between the drain structure DE and the source structure SE to electrically connect the drain structure DE and the source structure SE. The channel structure SS includes a channel layer 46 and an insulating layer 34 stacked sequentially in a horizontal direction D2 or a horizontal direction D3 opposite to the horizontal direction D2, wherein the insulating layer 34 may be used to indirectly control the composition of the channel structure SS and/or support the channel structure SS. The metal nitride layer 50 is disposed between the channel structure SS and the gate structure GE, for isolating the gate dielectric layer 28 from directly contacting the gate structure GE and avoiding the dielectric material of the gate dielectric layer 28 reacting with the metal material of the gate structure GE to generate a high-resistance product. A portion of the bottom dielectric layer 20 is sandwiched between the metal nitride layer 50 and the source structure SE, that is, the metal nitride layer 50 will not physically contact the source structure SE. On the other hand, a top surface of the metal nitride layer 50 is preferably lower than a top surface of the channel structure SS, for example being between the top surface of the channel structure SS and the top surface of the gate structure GE. Also, the metal nitride layer 50 is further covered by the gate dielectric layer 28, to also not physically contact the drain structure DE. In one embodiment, the metal nitride layer 50 for example includes titanium (Ti), titanium nitride (TiN), tantalum (Ta), tantalum nitride (TaN), tungsten nitride (WN), or other suitable conductive barrier material, and preferably includes titanium nitride, but is not limited thereto. Accordingly, through disposing the metal nitride layer 50, the component efficiency of the gate structure GE and the channel structure SS will be dramatically improved, to promote the performance of the semiconductor device 101.

Further in view of FIG. 1, the semiconductor device 101 further includes a dielectric layer 10, a bottom semiconductor layer 18, a dielectric layer 26, a dielectric layer 38, a through hole OP1 and an opening OP2. The aforementioned source structure SE, the bottom dielectric layer 20, the gate structure GE, the gate dielectric layer 28, the channel structure SS, the drain structure DE, and the metal nitride layer 50 are all disposed on the dielectric layer 10, and the dielectric layer 10 is disposed on a substrate (not shown in the drawings). The substrate for example includes a silicon substrate, a silicon-containing substrate, an epitaxial silicon substrate, a silicon-on-insulator (SOI) substrate, or a substrate made of other suitable materials, but not limited thereto. In addition, people skilled in the art should easily realize that any required active components and/or passive component may be further formed on the substrate or in the substrate due to product requirements. In the vertical direction D1, the bottom semiconductor layer 18 is disposed between the bottom dielectric layer 20 and the source structure SE, the dielectric layer 26 is disposed between the gate structure GE and the drain structure DE, the dielectric layer 38 is disposed on the dielectric layer 26, and the drain structure DE is disposed in the dielectric layer 38, but not limited thereto. It is noted that, the through hole OP1 penetrates through the dielectric layer 26 and the gate structure GE in the vertical direction D1, and the opening OP2 penetrates through the bottom dielectric layer 20 in the vertical direction D1, with the through hole OP1 directly connecting the opening OP2, and with the through hole OP1 having a relative greater diameter to completely overlap the opening OP2, but not limited thereto. Accordingly, the metal nitride layer 50, the gate dielectric layer 28 and a portion of the channel structure SS are sequentially disposed within the through hole OP1 in the horizontal direction D2 or in the horizontal direction D3, and another portion of the channel structure SS is disposed in the opening OP2. In this way, the channel structure SS further penetrates the bottom dielectric layer 20 in the vertical direction D1 to physically contact the bottom semiconductor layer 18. People in the art should easily realize that the through hole OP1 and the opening OP2 according to the present disclosure are not limited to the aforementioned type, and the through hole OP1 and the opening OP2 may have other different arrangements or shape based on practical product requirements.

Precisely speaking, the channel layer 46 further includes a first semiconductor layer 30, a second semiconductor layer 32, and a third semiconductor layer 36 stacked sequentially in the horizontal direction D2 or the horizontal direction D3. The first semiconductor layer 30 is disposed in the through hole OP1, the second semiconductor layer 32 is partially disposed in the through hole OP1 and partially disposed in the opening OP2, and the third semiconductor layer 36 is also disposed in the through hole OP1, between the insulating layer 34 and the drain structure DE. In the present embodiment, the first semiconductor layer 30 is around the second semiconductor layer 32 in the horizontal direction D2 and/or the horizontal direction D3, the second semiconductor layer 32 surrounds the third semiconductor layer 36 and the insulating layer 34 in the horizontal direction D2 and/or the horizontal direction D3. Then, the second semiconductor layer 32 includes an U-shape cross section as shown in FIG. 1, between the drain structure DE and the bottom semiconductor layer 18 in the vertical direction D1, and the first semiconductor layer 30 includes an I-shaped cross section as shown in FIG. 1, between the drain structure DE and the gate dielectric layer 28. Accordingly, the second semiconductor layer 32 of the channel layer 46 physically contacts the first semiconductor layer 30, the third semiconductor layer 36 and the bottom semiconductor layer 18 at the same time, and the channel layer 46 is allowable to be electrically connected to the drain structure DE and the source structure SE while a threshold voltage is applied to the gate structure GE. In one embodiment, the bottom semiconductor layer 18 and the first semiconductor layer 30, the second semiconductor layer 32, and the third semiconductor layer 36 of the channel layer 46 for example include a semiconductor material like doped polysilicon, doped amorphous silicon, indium zinc oxide (IZO), aluminum zinc oxide (AZO) or indium gallium zinc oxide (IGZO), but is not limited thereto. Also, the materials of the first semiconductor layer 30, the second semiconductor layer 32, the third semiconductor layer 36 and the bottom semiconductor layer 18 may be optionally the same or different from each other.

The gate dielectric layer 28 further includes a first portion 28A extending in the vertical direction D1, and second portions 28B, 28C extending in the horizontal direction D2 or the horizontal direction D3. The first portion 28A is sandwiched between the first semiconductor layer 30 and the gate structure GE in the horizontal direction D2 or the horizontal direction D3, and the second portions 28B, 28C is sandwiched between the first semiconductor layer 30 and the bottom dielectric layer 20, or sandwiched between the drain structure DE and the metal nitride layer 50, but not limited thereto. In one embodiment, the dielectric layer 10, the bottom dielectric layer 20, the dielectric layer 26, the dielectric layer 38, and the gate dielectric layer 28 for example all include a dielectric material like silicon oxide, silicon nitride, silicon oxynitride, or silicon carbonitride, or a high dielectric constant dielectric material, and preferably all includes silicon oxide, but is not limited thereto. In another embodiment, the gate dielectric layer 28 may optionally include a monolayer or multilayer, and preferably includes an oxide layer (not shown in the drawings) and a high dielectric constant dielectric layer (not shown in the drawing) stacked one over another.

Preferably, the source structure SE, the gate structure GE and the drain structure DE respectively include a multilayer structure. For example, the source structure SE includes a barrier layer 12, a conductive layer 14, and a barrier layer 16 stacked sequentially in the vertical direction D1, the gate structure GE includes a gate barrier layer 22 and a gate layer 24 stacked sequentially in the vertical direction D1, and the drain structure DE includes a barrier layer 40 and a conductive layer 42 stacked sequentially in the vertical direction D1, but is not limited thereto. In other embodiments, the barrier layer 12, the barrier layer 16, the gate barrier layer 22, and/or the barrier layer 40 may be optionally omitted or further include a multilayer, based on practical product requirements, but not limited thereto. In one embodiment, the gate barrier layer 22 and the metal nitride layer 50 preferably include the same material, for example both include but not limited to titanium nitride, so that, the gate barrier layer 22 may serve as an extension of the metal nitride layer 50 in the horizontal direction D2 or the horizontal direction D3. In the present embodiment, bottom surfaces of the gate barrier layer 22 and the metal nitride layer 50 are coplanar with each other, to together present in a L-shaped cross section, as shown in FIG. 1, but not limited thereto. Furthermore, the conductive layer 14, the gate layer 24, and the conductive layer 42 all include copper, aluminum, tungsten or other suitable low-resistance metal materials, and the materials of the conductive layer 14, the gate layer 24, and the conductive layer 42 may be optionally the same or different from each other, preferably all including tungsten, but not limited thereto.

It is noteworthy that, the first semiconductor layer 30, the second semiconductor layer 32 and the insulating layer 34 together present in a columnar structure extending in the vertical direction D1, with the central axes of columnar structures in the vertical direction D1 being substantially overlapped with one another, and the gate dielectric layer 28 presents in an annular structure surrounding the channel structure SS and is between the gate structure GE and the channel structure SS. With these arrangements, the source structure SE, the gate structure GE, the gate dielectric layer 28, the channel structure SS, and the drain structure DE may together form a three-dimensional (3D) transistor component, with the channel structure SS serving as the vertical channel structure of the 3D transistor component, and with the gate structure GE surrounding outside the channel structure SS to function like a gate-all-around (GAA). Through these, the semiconductor device 101 of the present embodiment may be electrically connected to other active components and/or passive components upwardly and/or downwardly through other interconnections in the subsequent processes, and the device efficiency of the inner gate structure GE, as well as the channel structure SS, can be effective improved through the arrangement of the metal nitride layer 50, gaining more optimized operation performance.

In order to make people skilled in the art of the present disclosure easily understand the semiconductor device of the present disclosure, the fabricating method of the semiconductor device in the present disclosure will be further described below.

Figure 2:
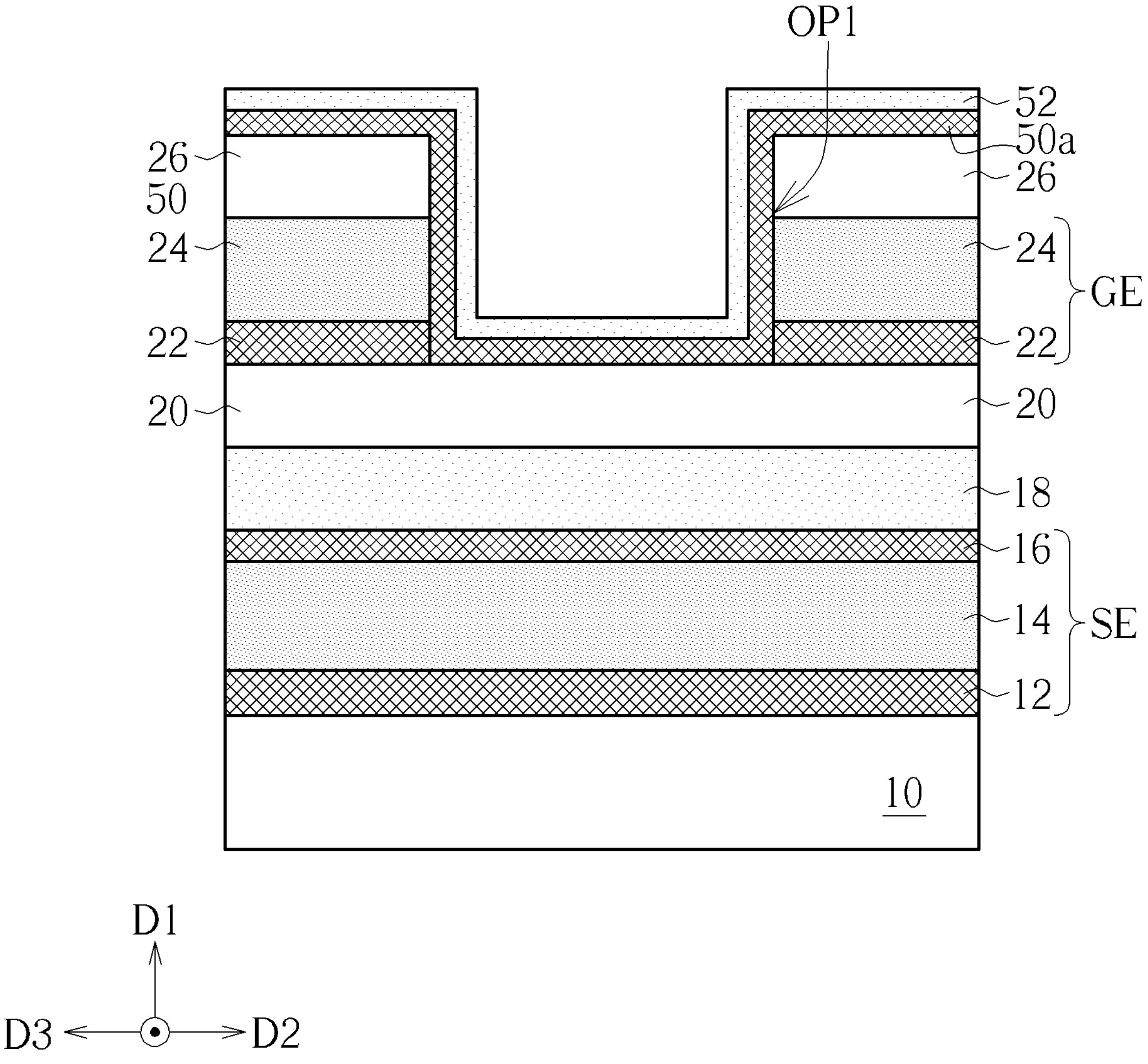

Please refer to FIG. 2 to FIG. 11, illustrating schematic diagrams of a fabricating method of the semiconductor device 101 according to one embodiment in the present disclosure. Firstly, as shown in FIG. 2, the source structure SE, the bottom semiconductor layer 18, the bottom dielectric layer 20, the gate structure GE, and the dielectric layer 26 are sequentially formed on the dielectric layer 10, and the through hole OP1 is formed to sequentially penetrate through the dielectric layer 26, and the gate structure GE, to partially expose the bottom dielectric layer 20. Then, further in view of FIG. 2, a metal nitride material layer 50*a* and a semiconductor material layer 52 are sequentially formed conformaly covering the top surface of the dielectric layer 26, and covering a bottom surface and a sidewall of the through hole OP1. That is, the metal nitride material layer 50*a* and the semiconductor material layer 52 are both partially formed within the through hole OP1, and partially formed outside the through hole OP1. In one embodiment, the metal nitride material layer 50*a* for example includes titanium, titanium nitride, tantalum, tantalum nitride, tungsten nitride or other suitable conductive barrier material, and preferably includes a material the same as that of the gate barrier layer 22 such as titanium nitride. The semiconductor material layer 52 for example includes a semiconductor material like doped polysilicon or doped amorphous silicon, but is not limited thereto.

Figure 3:
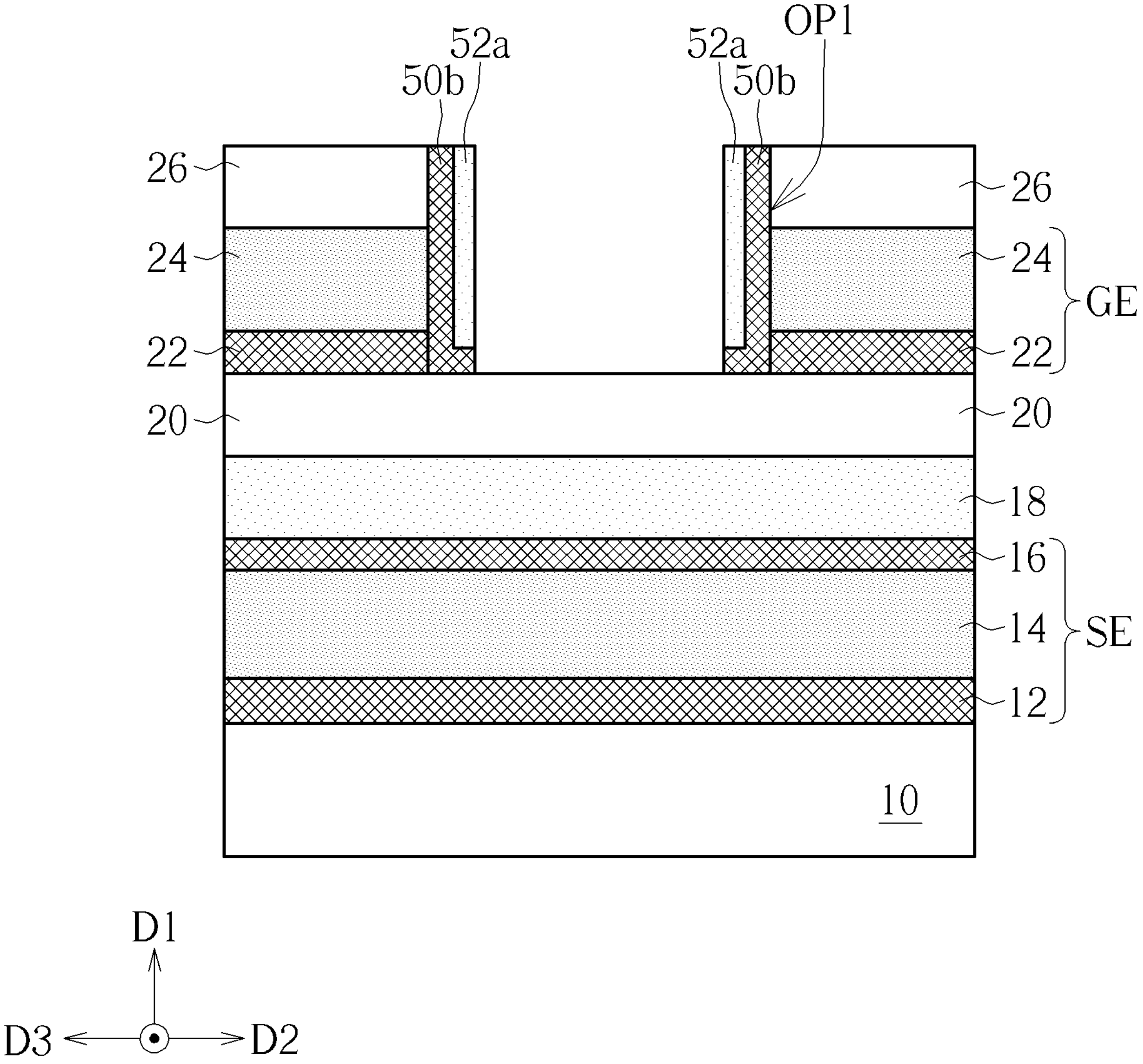

Next, an etching back process is performed to remove the semiconductor material layer 52 and the metal nitride material layer 50*a* disposed outside the through hole OP1, and to also remove the semiconductor material layer 52 and the metal nitride material layer 50*a* covering on the bottom surface of the through hole OP1, to form a semiconductor material layer 52*a* and the metal nitride material layer 50*b* only disposed on the sidewall of the through hole OP1, as shown in FIG. 3. The metal nitride material layer 50*b* and the semiconductor material layer 52*a* are stacked sequentially on the sidewall of the through hole OP1 in the horizontal direction D2 or in the horizontal direction D3, to respectively include a L-shaped cross section and an I-shaped cross section. The top surfaces of the metal nitride material layer 50*b* and the semiconductor material layer 52*s* are all at the same plane with the top surface of the dielectric layer 26, but not limited thereto.

Figure 4:
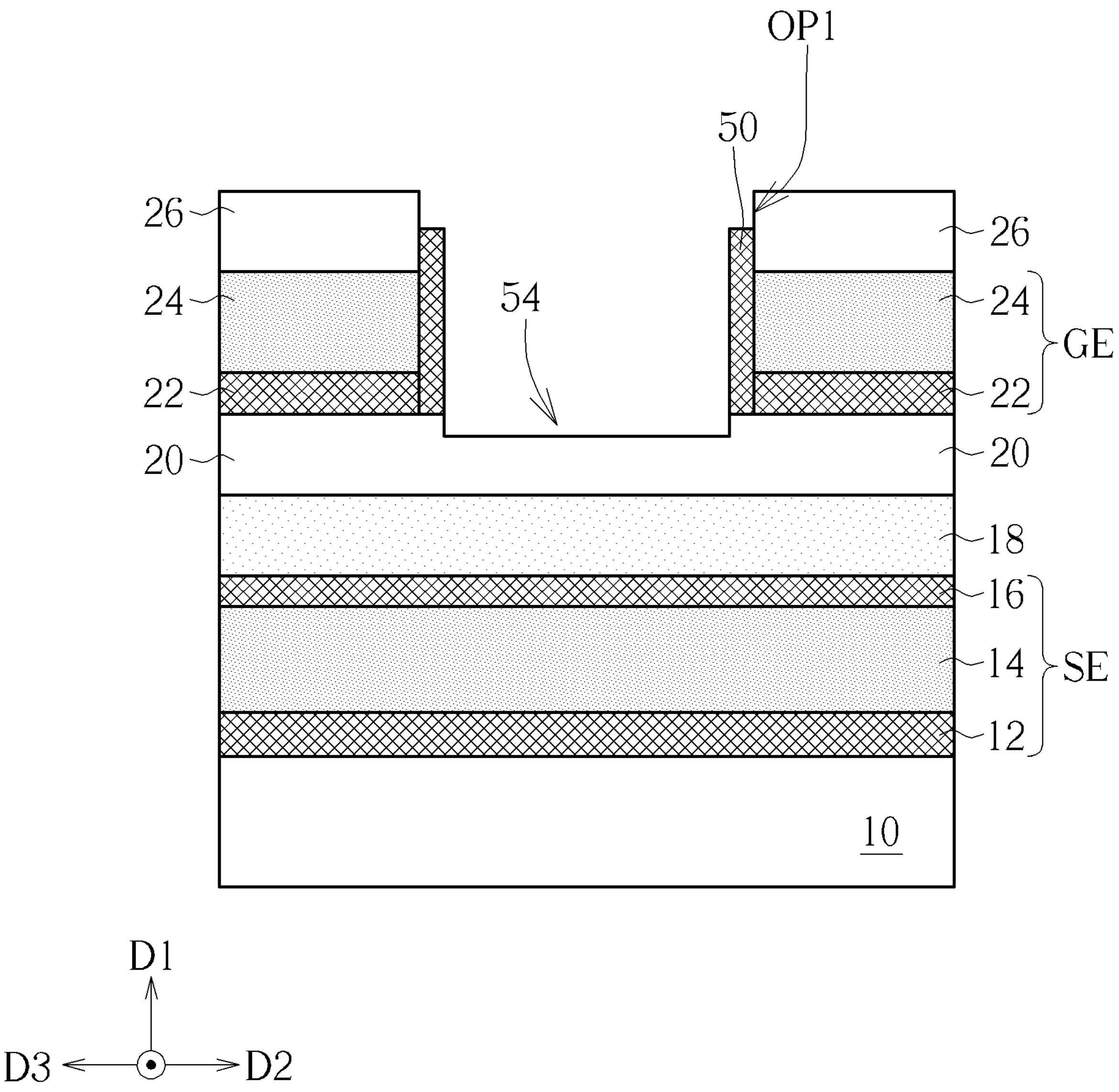

Then, an etching process is performed to completely remove the semiconductor material layer 52*a*, and to partially remove the metal nitride material layer 50*b* and the bottom dielectric layer 20 underneath, to form the metal nitride layer 50 with a relative lower top surface on the sidewall of the through hole OP1, and to form a recess 54 having a relative lower top surface within the bottom dielectric layer 20 exposed from the through hole OP1, as shown in FIG. 4. The top surface of the metal nitride layer 50 is obviously lower than the top surface of the dielectric layer 26, and the sidewall of the metal nitride layer 50 is vertically aligned with the sidewall of the recess 54.

Figure 5:
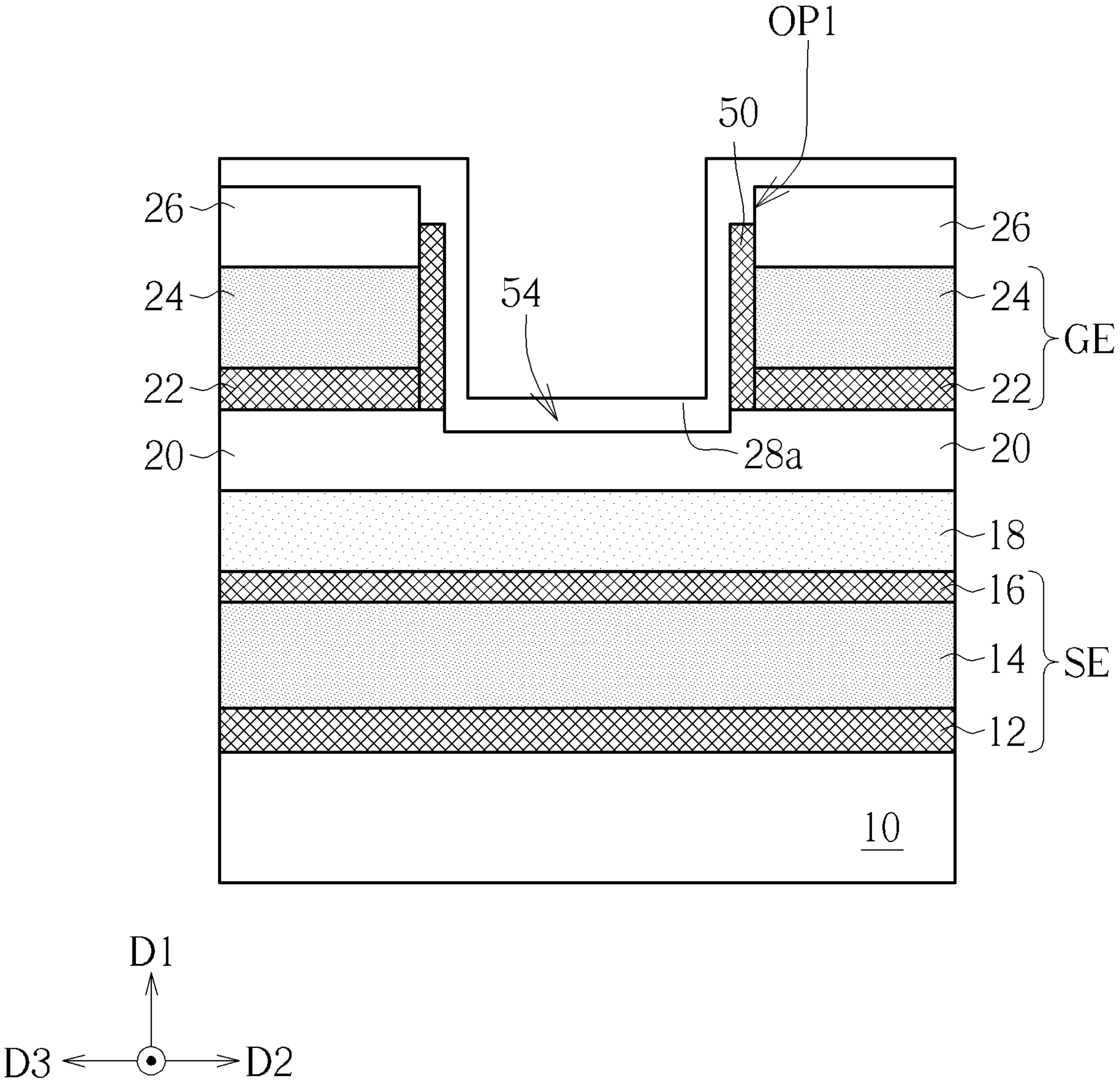

As shown in FIG. 5, a gate dielectric material layer 28*a* is conformally formed on the top surface of the dielectric layer 26 and the bottom surface and the sidewall of the through hole OP1, completely covering the metal nitride layer 50 and filling up the recess 54. That is, the gate dielectric material layer 28*a* is also partially formed within the through hole OP1 and is partially formed outside the through hole OP1. In one embodiment, the gate dielectric material layer 28*a* for example includes a dielectric material layer like silicon oxide, silicon nitride, silicon oxynitride or silicon carbonitride, or a high dielectric constant dielectric material, and preferably includes a material the same as that of the dielectric layer 26 and the bottom dielectric layer 20 such as silicon oxide, but is not limited thereto. Also, the formation of the gate dielectric material layer 28*a* may be carried out through a film forming process, such as a chemical vapor deposition process, a physical vapor deposition process, or other suitable approaches, but not limited thereto. In another embodiment, the gate dielectric material layer 28*a* may optionally include a monolayer or a multilayer, for example includes an oxide layer (not shown in the drawings) and a high dielectric constant dielectric layer (not shown in the drawings) stacked on one over another.

Figure 6:
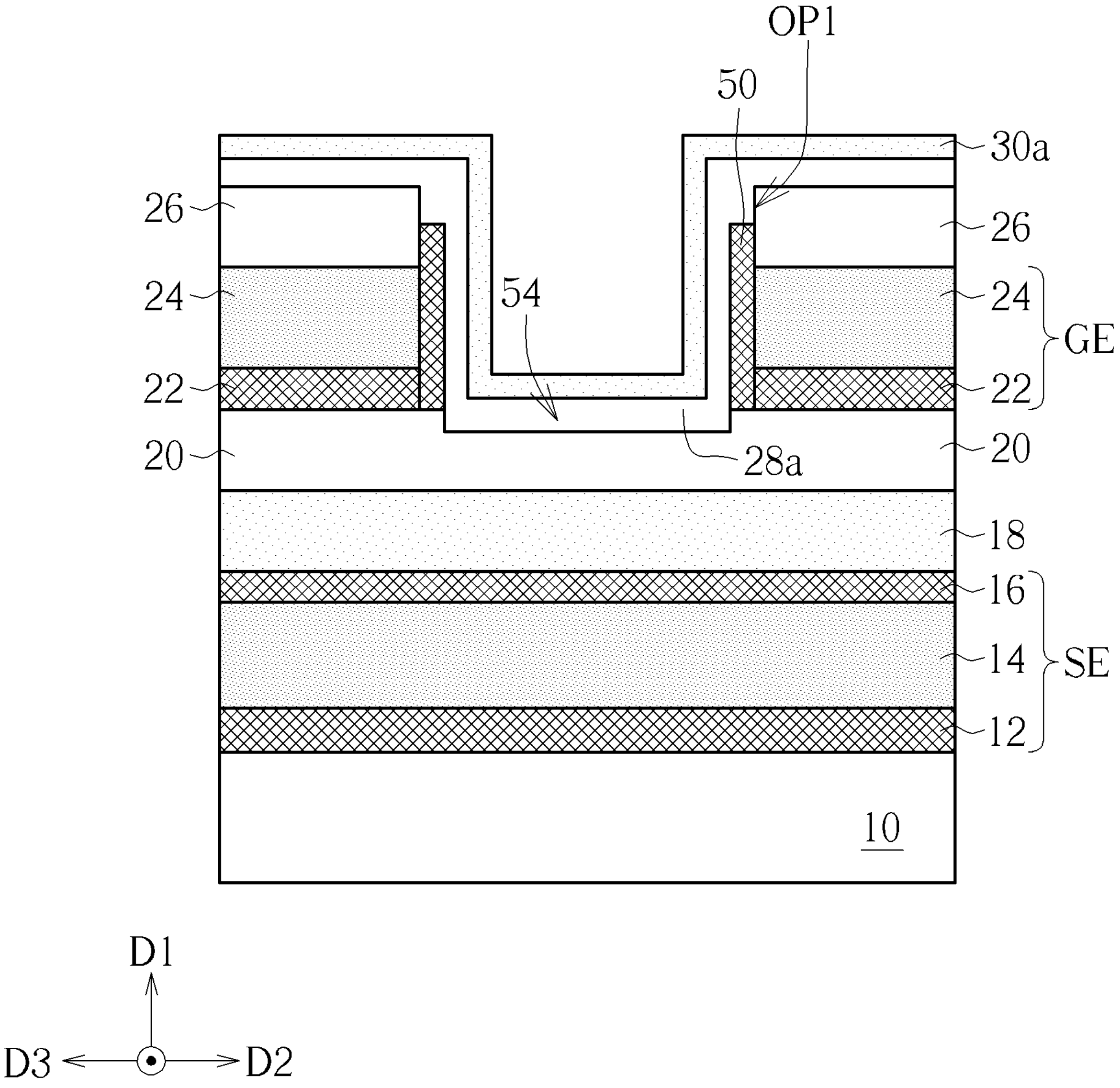

As shown in FIG. 6, a first semiconductor material layer 30*a* is formed on the gate dielectric material layer 28*a*, which is also conformally formed on the gate dielectric material layer 28*a*, so that, the first semiconductor material layer 30*a* may also be partially formed within the through hole OP1 and partially formed outside the through hole OP1. In one embodiment, the first semiconductor material layer 30*a* for example includes a semiconductor material like a doped polysilicon, a doped amorphous silicon, indium zinc oxide, aluminum zinc oxide or indium gallium zinc oxide, and preferably includes indium zinc oxide or indium gallium zinc oxide, but not limited thereto. In addition, the formation of the first semiconductor material layer 30*a* may also be carried out through a film forming process, such as a chemical vapor deposition process, a physical vapor deposition process, or other suitable approaches, but not limited thereto.

Figure 7:
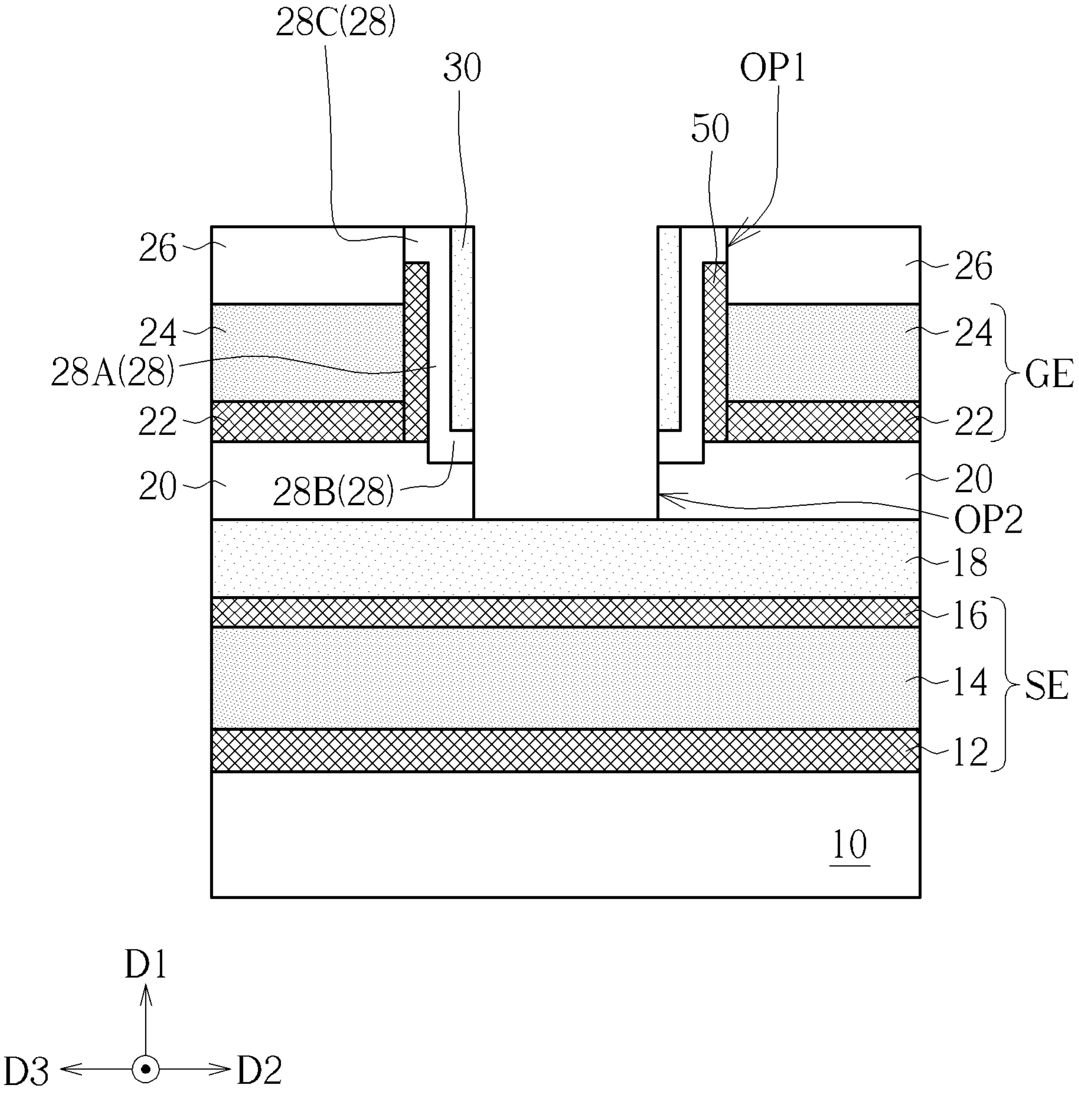

After that, as shown in FIG. 7, the first semiconductor material layer 30*a* and the gate dielectric material layer 28*a* disposed outside the through hole OP1 are removed, the first semiconductor material layer 30*a* and the gate dielectric material layer 28*a* disposed on the bottom surface of the through hole OP1 are also removed, and the bottom dielectric layer 20 exposed from the though hole OP1 is further removed, to form the opening OP2 penetrating through the bottom dielectric layer 20 to expose a portion of the bottom semiconductor layer 18. In one embodiment, the opening OP2 is overlapped with the through hole OP1 in the vertical direction D1, and a projection area of the opening OP2 in the vertical direction D1 is smaller than a projection area of the through hole OP1 in the vertical direction D1. Then, the opening OP2 may be direction connected to the through hole OP1, but is not limited thereto. On the other hand, through removing the first semiconductor material layer 30*a* and the gate dielectric material layer 28*a*, after forming the opening OP2, the first semiconductor layer 30 and the gate dielectric layer 28 having the first portion 28A and the second portions 28B, 28C are both formed on the sidewall of the through hole OP1 at the same time. The first semiconductor layer 30 and the gate dielectric layer 28 have coplanar top surfaces, with the top surfaces at the same plane with the top surface of the dielectric layer 26, and the gate dielectric layer 28 completely covers the metal nitride layer 50.

Figure 8:
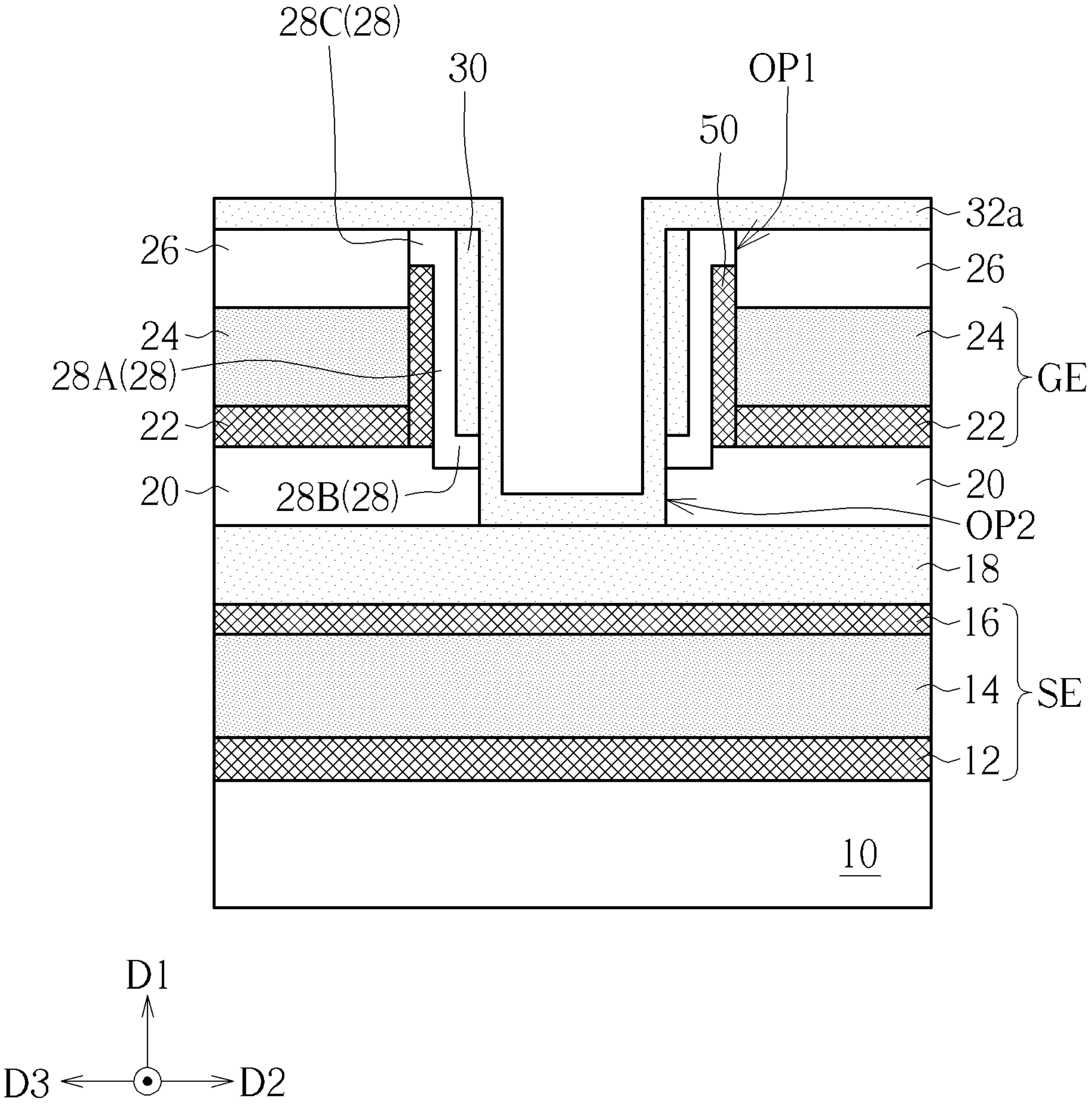

As shown in FIG. 8, after forming the opening OP2, a second semiconductor material layer 32*a* is formed to partially dispose within the through hole OP1, to partially dispose within the opening OP2, and to partially dispose outside the through hole OP1 and the opening OP2. Precisely speaking, the second semiconductor material layer 32*a* is conformally formed on a bottom surface and a sidewall of the opening OP2, a sidewall of the gate dielectric layer 28, and a sidewall of the first semiconductor layer 30, and the second semiconductor material layer 32*a* disposed outside the through hole OP1 and the opening OP2 covers the top surfaces of the dielectric layer 26, the gate dielectric layer 28 and the first semiconductor layer 30. In the present embodiment, the first semiconductor layer 30 surrounds outside the second semiconductor material layer 32*a* disposed within the through hole OP1, and the second semiconductor material layer 32*a* disposed within the opening OP2 physically contacts the exposed top surface of the bottom semiconductor layer 18. In one embodiment, the second semiconductor material layer 32*a* for example also includes a semiconductor material like a doped polysilicon, a doped amorphous silicon, indium zinc oxide, aluminum zinc oxide or indium gallium zinc oxide, and preferably includes the same material as the first semiconductor layer 30 like indium zinc oxide or indium gallium zinc oxide, but not limited thereto. Furthermore, the formation of the second semiconductor material layer 32*a* is for example also carried out through a film forming process, such as a chemical vapor deposition process, a physical vapor deposition process or other suitable approaches, but not limited thereto.

Figure 9:
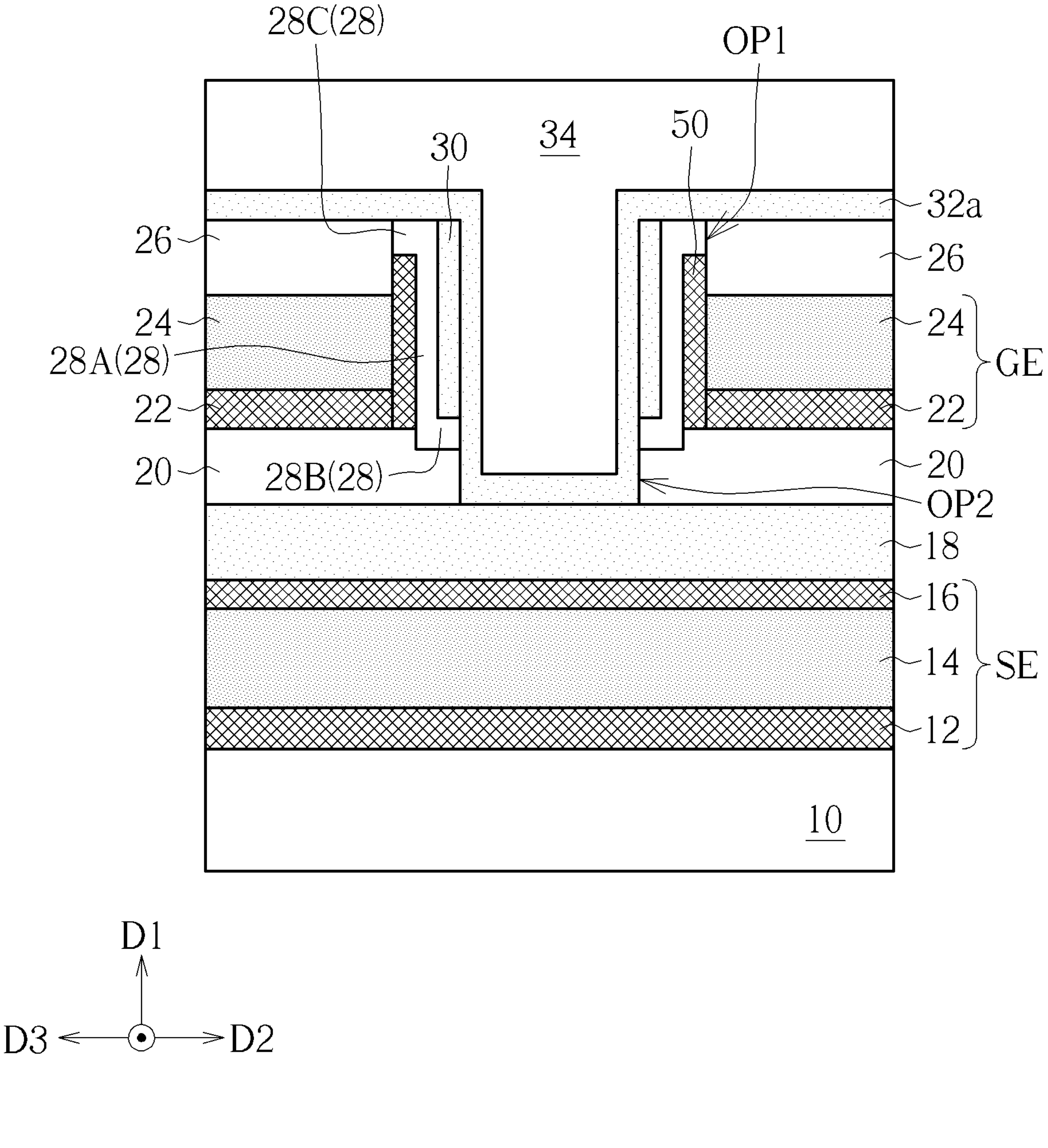

As shown in FIG. 9, after forming the second semiconductor material layer 32*a*, an insulating material layer 34*a* is formed to fill up the opening OP2 and the through hole OP1, and to further cover on the second semiconductor material layer 32*a* outside the through hole OP1. In other words, the second semiconductor material layer 32*a* is partially formed within the through hole OP1, partially formed within the opening OP2, and is partially formed outside the through hole OP1 and the opening OP2. In one embodiment, the insulating material layer 34*a* for example includes a dielectric material layer, such as silicon oxide, silicon nitride, silicon oxynitride or silicon carbonitride, and preferably includes silicon oxide, but not limited thereto. Also, the formation of the insulating material layer 34*a* may also be carried out through a film forming process, such as a chemical vapor deposition process, a physical vapor deposition process or other suitable approaches, but not limited thereto.

Figure 10:
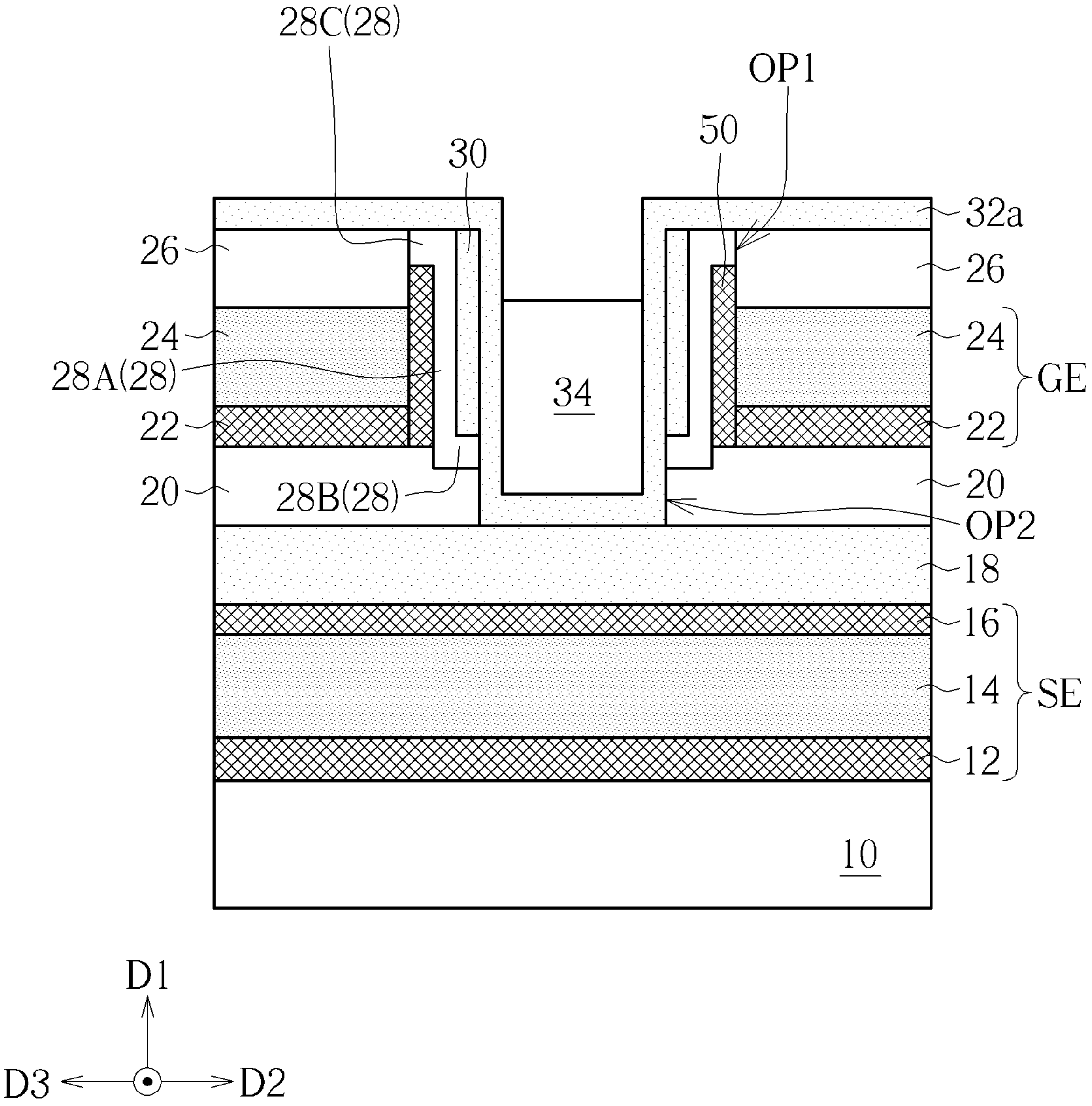

Then, another etching back process is performed to remove a portion of the insulating material layer 34*a*, for example removing the insulating material layer 34*a* disposed outside the through hole OP1 and the opening OP2, and removing the insulating material layer 34*a* disposed within the through hole OP1 at the same time, to form an insulating layer 34, as shown in FIG. 10. Then, a topmost surface of the insulating layer 34 is lower than the top surface of the dielectric layer 26 in the vertical direction D1.

Figure 11:
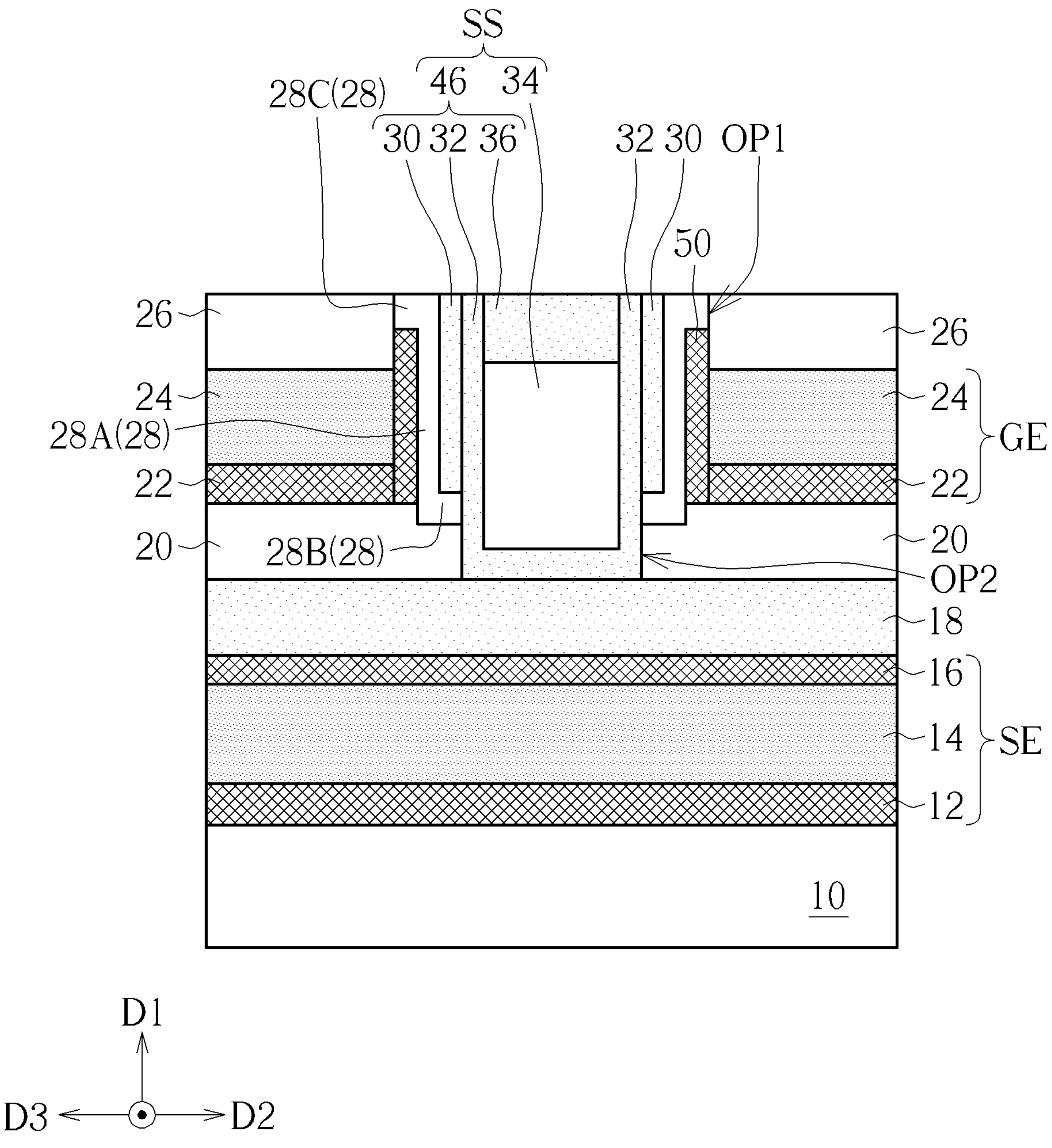

After forming the insulating layer 34, a third semiconductor material layer (not shown in the drawings) is formed to fill up the through hole OP1, to further cover the second semiconductor material layer 32*a* disposed outside the through hole OP1. Then, another etching process is performed, to remove the third semiconductor material layer and the second semiconductor material layer 32*a* disposed outside the through hole OP1, to form the third semiconductor layer 36 and the second semiconductor layer 32, as shown in FIG. 11. In one embodiment, the third semiconductor material layer for example also includes a semiconductor material like doped polysilicon, doped amorphous silicon, indium zinc oxide, aluminum zinc oxide or indium gallium zinc oxide, and preferably includes the same material as the first semiconductor layer 30 and/or the second semiconductor layer 32 like indium zinc oxide or indium gallium zinc oxide, but not limited thereto. The top surface of the gate dielectric layer 28, the top surface of the first semiconductor layer 30, the top surface of the second semiconductor layer 32, and the top surface of the third semiconductor layer 36 are leveled with each other, and are at the same plane with the top surface of the dielectric layer 26, but is not limited thereto. Accordingly, the first semiconductor layer 30, the second semiconductor layer 32 and the third semiconductor layer 36 sequentially stacked in the horizontal direction D2 or in the horizontal direction D3 within the through hole OP1 together form the channel layer 46, and the channel layer 46 and the insulating layer 34 together form the channel structure SS. People skilled in the art should easily realize that the fabrication of the channel structure SS is not limited to be formed through the aforementioned process, and which may be further adjusted based on practical product requirements.

Furthermore, after forming the channel structure SS, the dielectric layer 38 and the drain structure DE are continuously formed, with the drain structure DE being formed on the channel structure SS and the gate dielectric layer 28, to completely cover the through hole OP1. That is, the bottom surface of the drain structure DE and the top surface of the channel structure SS are at the same plane. With these performances, the semiconductor device 101 as shown in FIG. 1 is fabricated, wherein, the second semiconductor layer 32 of the channel layer 46 physically contacts the first semiconductor layer 30, the third semiconductor layer 36 and the bottom semiconductor layer 18 at the same time, so as to electrically connect the drain structure DE and the source structure SE.

Accordingly, the fabrication of the semiconductor device 101 of the present embodiment is accomplished. Based on the fabricating method of the present embodiment, the source structure SE is firstly formed on the dielectric layer 10, and the gate structure GE is next formed on the source structure SE. Then, the through hope OP1 penetrated through the gate structure GE in the vertical direction D1 is formed, followed by sequentially forming the metal nitride layer 50, the gate dielectric layer 28, the channel structure SS and the insulating layer 34 in the through hole OP1. With these arrangements, at least a portion of the channel structure SS is disposed within the gate structure GE, between the drain structure DE and the source structure SE, and which is electrically connected to the drain structure DE and the source structure SE through the second semiconductor layer 32. Also, the metal nitride layer 50 is disposed between the channel structure SS and the gate structure GE, to isolate the gate dielectric layer 28 from directly contacting the gate structure GE, to avoid the dielectric material of the gate dielectric layer 28 directly contacting the metal material of the gate structure GE and easily producing high-resistance products. In this way, the arrangement of the metal nitride layer 50 is allowable to effectively improve the component efficiency of the gate structure GE and the channel structure SS, thereby enhancing the operation performance of the semiconductor device 101.

People in the art should fully realize that the semiconductor device and the fabricating method thereof are not limited to the aforementioned embodiment and may include other examples or may be achieved through other strategies to meet practical product requirements. The following description will detail the different embodiments of the semiconductor device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 12:
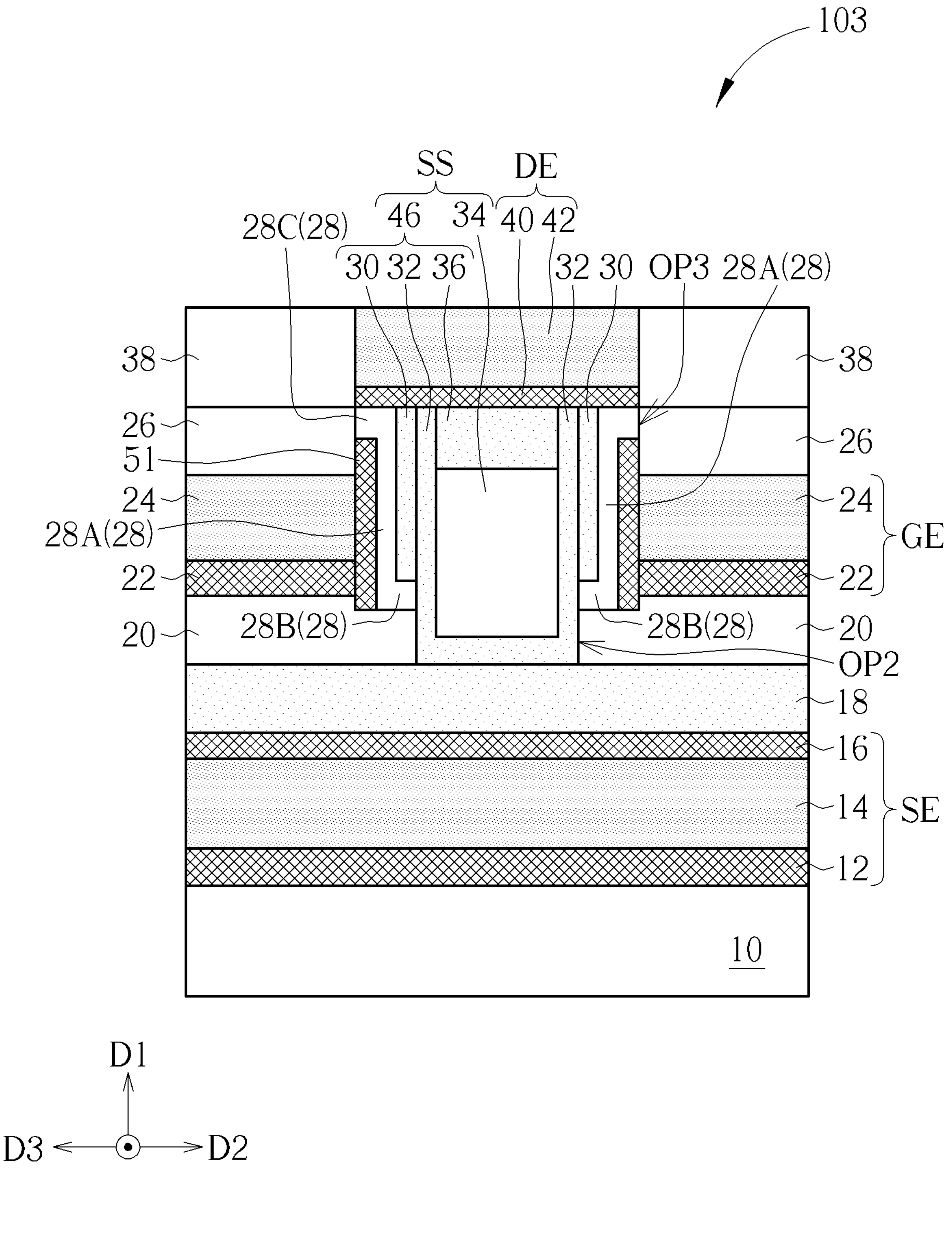
FIG. 12 is a cross-sectional schematic diagram illustrating a semiconductor device according to a second embodiment of the present disclosure.

Please refer to FIG. 12, illustrating a schematic diagram of a cross-sectional view of a semiconductor device 103 according to the second embodiment of the present disclosure. As shown in FIG. 12, the structure of the semiconductor device 103 according to the present embodiment is substantially the same as the structure of the semiconductor device 101 according to the aforementioned first embodiment, which also including the source structure SE, the bottom dielectric layer 20, the gate structure GE, the gate dielectric layer 28, the channel structure SS, and the drain structure DE, and all similarities will not be redundantly described hereinafter. The semiconductor device 103 of the present embodiment and the aforementioned first embodiment is mainly in that the bottom surface of the metal nitride layer 51 is lower than the bottom surface of the gate barrier layer 22, still not physically contacting the source structure SE.

Precisely speaking, a through hole OP3 is formed in the vertical direction D1 to penetrating through the dielectric layer 26, the gate structure GE, and a portion of the bottom dielectric layer 20, so that, the metal nitride layer 51, the gate dielectric layer 28, and the first semiconductor layer 30 formed subsequently in the through hole OP3 will together include a bottom surface being lower than the gate barrier layer 22, and the metal nitride layer 51 still not physically contacts the source structure SE. On the other hand, the top surface of the metal nitride layer 51 is still lower than the top surface of the channel structure SS, for example being between the top surface of the channel structure SS and the top surface of the gate structure GE, and being further coving by the gate dielectric layer 28, and which cannot physically contact the drain structure DE either. With these arrangements, the metal nitride layer 51 of the present embodiment will also insulate the gate dielectric layer 28 from directly contacting the gate structure GE, to avoid the dielectric material of the gate dielectric layer 28 directly contacting the metal material of the gate structure GE and easily producing high-resistance products. In this way, the arrangement of the metal nitride layer 51 is also allowable to effectively improve the component efficiency of the gate structure GE and the channel structure SS, thereby improving the operation performance of the semiconductor device.

To summarize the above descriptions, the metal nitride layer is additionally formed between the channel structure and the gate structure, to avoid the dielectric material of the gate dielectric layer 28 directly contacting the metal material of the gate structure GE and easily producing high-resistance products, thereby improving the operation performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a source structure;

a drain structure, the source structure and the drain structure stacked disposed in a vertical direction;

a gate structure disposed between the drain structure and the source structure in the vertical direction;

a bottom dielectric layer, disposed between the drain structure and the source structure in the vertical direction;

a channel structure, disposed between the drain structure and the source structure in the vertical direction and electrically connected the drain structure and the source structure, the channel structure being partially disposed in the gate structure and comprising a channel layer and an insulating layer stacked sequentially in a horizontal direction;

a gate dielectric layer, disposed between the channel structure and the gate structure in the horizontal direction; and a metal nitride layer, disposed between the gate dielectric layer and the gate structure, wherein a portion of the bottom dielectric layer is sandwiched between the metal nitride layer and the source structure, and a top surface of the metal nitride layer is higher than a top surface of the gate structure.

2. The semiconductor device according to claim 1, wherein the top surface of the metal nitride layer is lower than a top surface of the channel structure.

3. The semiconductor device according to claim 1, wherein the top surface of the metal nitride layer is disposed between a top surface of the channel structure and the top surface of the gate structure.

4. The semiconductor device according to claim 1, wherein the drain structure, the source structure and the gate structure comprise a same metal material.

5. The semiconductor device according to claim 1, the gate structure further comprising:

a gate layer; and a gate barrier layer, disposed under the gate layer, the gate barrier layer physically contacting the metal nitride layer.

6. The semiconductor device according to claim 5, wherein the metal nitride layer and the gate barrier layer comprise a same material.

7. The semiconductor device according to claim 5, wherein the metal nitride layer and the gate barrier layer together comprise a L-shaped cross section.

8. The semiconductor device according to claim 5, wherein a bottom surface of the metal nitride layer is lower than a bottom surface of the gate barrier layer, and does not physically contact the source structure.

9. The semiconductor device according to claim 5, wherein a bottom surface of the metal nitride layer is coplanar with a bottom surface of the gate barrier layer, and does not physically contact the source structure.

10. The semiconductor device according to claim 1, the channel layer further comprises:

a first semiconductor layer, stacked on the gate dielectric layer, and not physically contacting the source structure; and a second semiconductor layer, stacked between the first semiconductor layer and the insulating layer, the second semiconductor layer physically contacting the source structure and the drain structure.

11. The semiconductor device according to claim 10, wherein the first semiconductor layer comprises an I-shaped cross section and the second semiconductor layer comprises an U-shaped cross section.

12. The semiconductor device according to claim 1, wherein the channel layer comprises zinc indium oxide, zinc aluminum oxide or zinc indium gallium oxide.

13. A fabricating method of a semiconductor device, comprising:

forming a source structure and a drain structure, the source structure and the drain structure stacked in a vertical direction;

forming a gate structure, the gate structure being formed between the drain structure and the source structure in the vertical direction;

forming a channel structure, the channel structure being formed between the drain structure and the source structure in the vertical direction and electrically connected the drain structure and the source structure, the channel structure being partially disposed in the gate structure and comprising a channel layer and an insulating layer stacked sequentially in a horizontal direction;

forming a gate dielectric layer, the gate dielectric layer being formed between the channel structure and the gate structure in the horizontal direction; and forming a metal nitride layer, between the gate dielectric layer and the gate structure, wherein the metal nitride layer comprises a conductive barrier material, wherein a top surface of the metal nitride layer is higher than a top surface of the gate structure.

14. The fabricating method of the semiconductor device according to claim 13, further comprising:

forming a through hole penetrating through the gate structure in the vertical direction;

before forming the channel structure, forming a metal nitride material layer in the through hole; and partially removing the metal nitride material layer, forming the metal nitride layer.

15. The fabricating method of the semiconductor device according to claim 14, wherein the top surface of the metal nitride layer is lower than a top surface of the channel structure.

16. The fabricating method of the semiconductor device according to claim 14, wherein the top surface of the metal nitride layer is between a top surface of the channel structure and the top surface of the gate structure.

17. The fabricating method of the semiconductor device according to claim 14, further comprising:

sequentially forming a gate dielectric material layer and a first semiconductor material layer in the through hole;

partially removing the gate dielectric material layer and the first semiconductor layer, to form the gate dielectric layer and a first semiconductor layer;

forming a second semiconductor material layer and an insulating material layer in the through hole; and partially removing the second semiconductor material layer and the insulating material layer, to form a second semiconductor layer and the insulating layer, the channel layer comprises the first semiconductor layer and the second semiconductor layer.

18. The fabricating method of the semiconductor device according to claim 17, wherein first semiconductor layer comprises an I-shaped cross section and the second semiconductor comprises an U-shaped cross section.

19. A semiconductor device, comprising:

a source structure;

a drain structure, the source structure and the drain structure stacked disposed in a vertical direction;

a gate structure disposed between the drain structure and the source structure in the vertical direction;

a bottom dielectric layer, disposed between the drain structure and the source structure in the vertical direction;

a channel structure, disposed between the drain structure and the source structure in the vertical direction and electrically connected the drain structure and the source structure, the channel structure being partially disposed in the gate structure and comprising a channel layer and an insulating layer stacked sequentially in a horizontal direction;

a gate dielectric layer, disposed between the channel structure and the gate structure in the horizontal direction; and a metal nitride layer, disposed between the gate dielectric layer and the gate structure, wherein a portion of the bottom dielectric layer is sandwiched between the metal nitride layer and the source structure, and the gate dielectric layer directly contacts a top surface of the metal nitride layer.

* * * * *